(12) United States Patent
Goldovsky et al.

(10) Patent No.: US 11,538,946 B1
(45) Date of Patent: Dec. 27, 2022

(54) DEEP ULTRAVIOLET AND INFRARED SILICON SENSOR MODULE

(71) Applicant: HILLBERRY GAT LTD., Rehovot (IL)

(72) Inventors: Viktor Goldovsky, Rehovot (IL); Yonohan Davidovich, Herzliya (IL); David Avner, Ramat Hasharon (IL)

(73) Assignee: HILLBERRY GAT LTD., Rehovot (IL)

( * ) Notice: Subject to any disclaimer, the term of this patent is extended or adjusted under 35 U.S.C. 154(b) by 0 days.

(21) Appl. No.: 17/305,318

(22) Filed: Jul. 4, 2021

(51) Int. Cl.
*G01J 5/02* (2022.01)
*H01L 31/0232* (2014.01)
*G01T 1/20* (2006.01)

(52) U.S. Cl.
CPC .......... *H01L 31/02322* (2013.01); *G01T 1/20* (2013.01)

(58) Field of Classification Search
CPC .......................... H01L 31/02322; G01T 1/20
See application file for complete search history.

(56) References Cited

U.S. PATENT DOCUMENTS

2013/0074927 A1\* 3/2013 Rachwal ............... C09B 57/001
546/100

FOREIGN PATENT DOCUMENTS

| WO | WO-2019116266 A1 | * | 6/2019 | ............. C09K 11/02 |
| WO | WO-2020058549 A1 | * | 3/2020 | ........... C03C 17/008 |

\* cited by examiner

*Primary Examiner* — Kiho Kim
(74) *Attorney, Agent, or Firm* — Reches Patents

(57) ABSTRACT

A sensor module that may include optics and a sensor located downstream to the optics. The optics may include a self-assembling polymer and luminescent elements embedded in the self-assembling polymer.

18 Claims, 4 Drawing Sheets

50

DEEP ULTRAVIOLET AND INFRARED SILICON SENSOR MODULE

BACKGROUND OF THE INVENTION

Silicon sensors, such as CMOS fabricated silicon sensors are inherently sensitive to visible light but are not sensitive to other frequency ranges such as deep ultraviolet (DUV) and infrared (IR).

Prior art DUV sensors and IR sensors are not fabricated based solely on CMOS and thus are usually expensive.

In addition—one of the costliest and time consuming steps of the fabrication of an optical sensor is the formation of optics—especially micro-machining lenses that should be very accurate and aligned with the sensors.

There is a growing need to provide a cost effective sensor module that may sense radiation outside the visible light range.

SUMMARY

There may be provided a sensor module that may include optics and a sensor located downstream to the optics. The optics may include a self-assembling polymer and luminescent elements embedded in the self-assembling polymer.

The self-assembling polymer may form a self-assembling polymer layer. The self-assembling polymer may form one or more regions that may or may not be layers.

The sensor has a certain spectral range for example—the visible light range.

The luminescent elements may be configured to convert radiation outside the certain spectral range to radiation within the spectral range.

The luminescent elements may include up-conversion luminescent elements and down-conversion luminescent elements.

The down-conversion luminescent elements may be configured to convert radiation having a wavelength below 300 nanometer to radiation within the certain spectral range.

The up-conversion luminescent elements may be configured to convert radiation having a wavelength above 1000 nanometer to radiation within the certain spectral range.

The up-conversion luminescent elements may be configured to convert infrared radiation to radiation within the certain spectral range.

The up-conversion luminescent elements may be configured to convert radiation having a wavelength between 1300 nanometers to 1800 nanometers radiation within the certain spectral range.

The sensor module may include a readout circuit.

The optics may be manufactured by a process that may include providing a solution made of the self-assembly polymer and luminescent elements that may be dissolved into a solvent; and depositing the solution on the sensor.

The optics may be manufactured by a process that may include selecting the polymer molecular weight of the self-assembling polymer based on a target thickness of a region formed by the self-assembling polymer.

The luminescent elements may exhibit a delay period that does not exceed 5 microseconds.

The polymer molecular weight of the self-assembling polymer exceeds 50 kDa.

The optics may consists essentially of the self-assembling polymer and the luminescent elements.

The optics may be without a window. Thus—the exterior of the self-assembling polymer may be the exterior of the sensor module.

The self-assembling polymer may be exposed to an environment of the sensor module.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
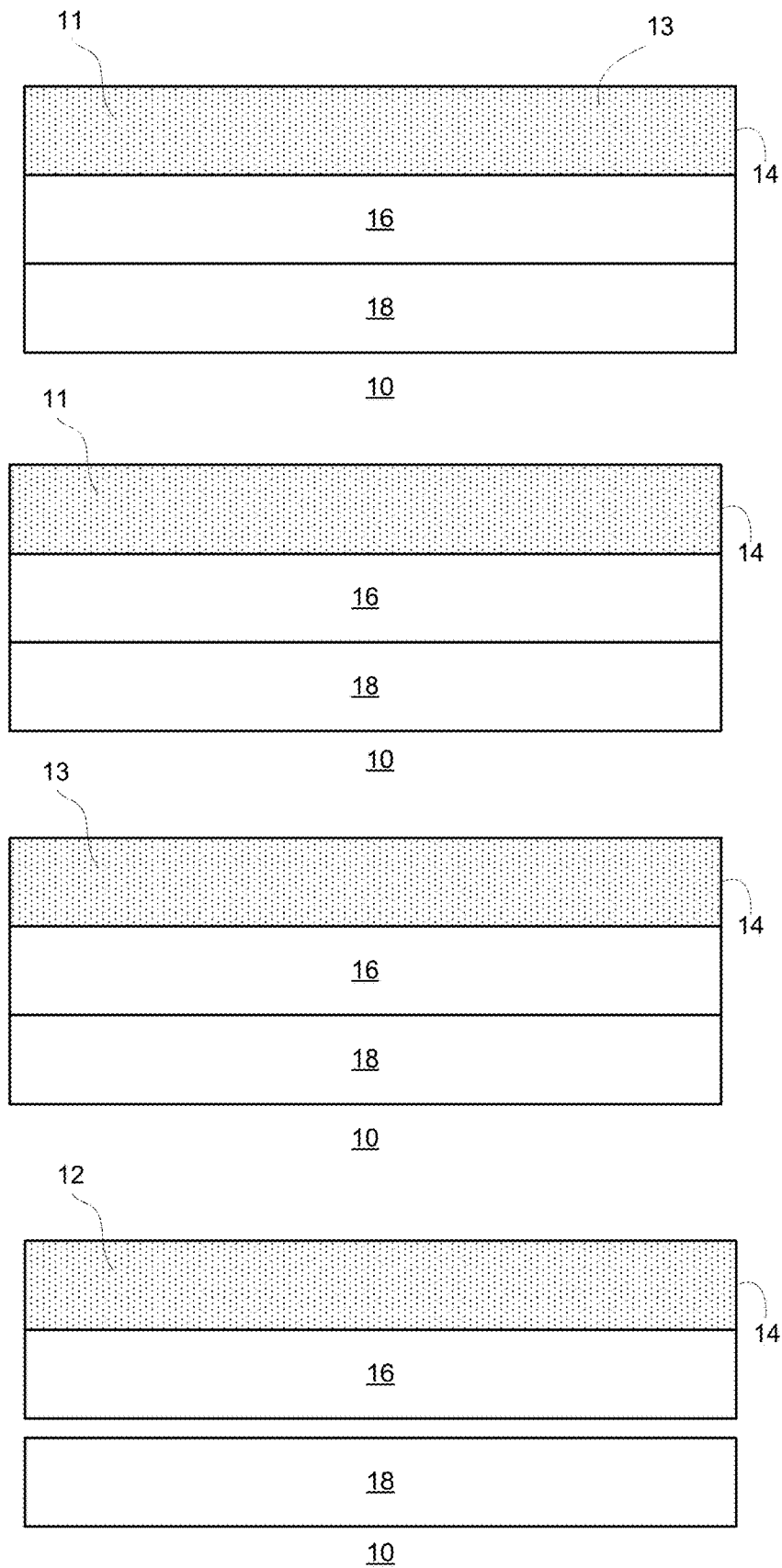
FIG. 1 is an example of a sensor module.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There may be provided a sensor module that may include optics and a sensor located downstream to the optics. The optics may include a self-assembling polymer and luminescent elements embedded in the self-assembling polymer.

Embedded in means that they are positioned within a region formed (at least in part) by the self-assembling polymer.

Using a self-assembling polymer greatly simplifies the manufacturing of the sensor module and may also increase the alignment between the sensor and the optics.

The self-assembling polymer may form a self-assembling polymer region. The value of the thickness of the region may be selected or otherwise defined. The self-assembling polymer and especially the polymer molecular weight of the self-assembling polymer may be selected to obtain the desired value of thickness of the region.

The sensor may be a silicon sensor—such as a CMOS fabricated silicon sensor that has a certain spectral range for example—the visible light range. The certain spectral range may be the frequency range in which the sensor senses radiation, the frequency range in which the sensor may sense radiation in an adequate manner. What can be regarded as an adequate manner can be defined in any manner—for example sense with at least a predefined sensitivity level, senses with at least a predefined signal to noise ratio, and the like.

The luminescent elements may be configured to convert radiation outside the certain spectral range to radiation within the spectral range.

The luminescent elements may include up-conversion luminescent elements and down-conversion luminescent elements.

The down-conversion luminescent elements may be configured to convert radiation having a wavelength below 300 nanometer to radiation within the certain spectral range.

The up-conversion luminescent elements may be configured to convert radiation having a wavelength above 1000 nanometer to radiation within the certain spectral range.

The up-conversion luminescent elements may be configured to convert infrared radiation to radiation within the certain spectral range.

The up-conversion luminescent elements may be configured to convert radiation having a wavelength between 1300 nanometers to 1800 nanometers radiation within the certain spectral range.

Non-limiting examples of compositions of luminescent elements are illustrated in US patent application 2008/0076058, US patent application 20120003582, and U.S. Pat. No. 10,210,526—all incorporated herein by reference.

Non-limiting examples of compositions of luminescent elements include aromatic chemicals, ionic salts and metal alloys.

Organic luminescent pigments (aromatic chemicals) may exhibit UV excitation and VIS emission. Such pigments may show red, blue or green colors by UV excitation and when be mixed together a variety of other colors can be obtained as well. For example—Perylenes, coumarines and others.

Non-limiting examples of compositions of luminescent elements may further include ionic salts are mostly presented by rare Earth ions complexes. The Rare-Earth ions complexes may be mixed with phosphine oxides or Mg/Ba and other salts as ligands, polymer systems doped with Rare-Earth metal ions and so on.

Non-limiting examples of compositions of luminescent elements may also include metal alloys/compositions Zinc compound, Barium and Manganese composition and so on.

The luminescent element may be transparent to radiation sensed by the sensor. The term "transparent" means that a degree of transparency of the luminescent elements does not affect (beyond an acceptable level which can be defined in any manner) the frequency response of the sensor module in frequency ranges where the sensor module is expected to sense radiation. For example, substantially transparent may be associated with an attenuation that may or may not exceed few (less than 10) percent.

It should be noted that there may be provided a device with multiple sensor modules—wherein one sensor module may have a different spectral range than a second sensor module.

FIG. 1 illustrates various examples of a sensor module 10 that include optics, sensor 16 and readout circuit 18. The optics may include self-assembling polymer 17 and luminescent elements. The luminescent elements may include up-conversion luminescent elements 11 and down-conversion luminescent elements 13. The luminescent elements may include only up-conversion luminescent elements 11 or only down-conversion luminescent elements 13. The luminescent elements may include luminescent elements 12 that may act as both up-conversion and down-conversion luminescent elements.

The readout circuit 18 may be located directly below the sensor 16—but may be located elsewhere.

Figure 2:
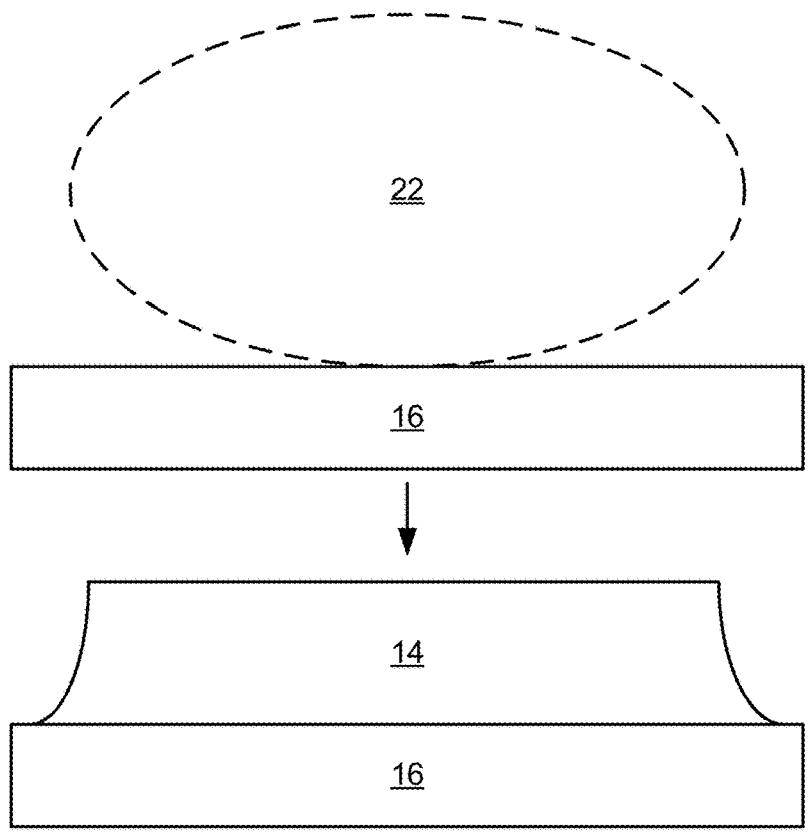
FIG. 2 is an example of a deposition of a solution on a sensor and a sensor module following an evaporation of a solvent.

FIG. 2 is an example of a deposition of a solution 22 on a sensor 16, it also includes an example of a part of the sensor module (optics 14 and sensor 16) following an evaporation of a solvent.

Figure 3:
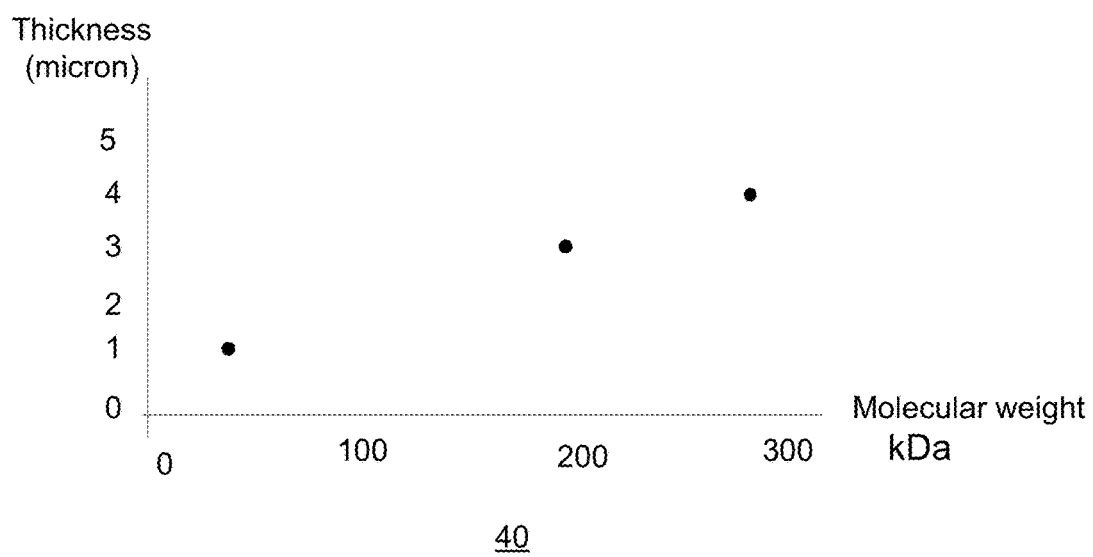
FIG. 3 is an example of a relationship between a thickness of the self-assembling polymer and a polymer molecular weight of the self-assembling polymer.

FIG. 3 is an example of a relationship between a thickness (Y-axis) of the self-assembling polymer and a polymer molecular weight (X-axis) of the self-assembling polymer.

Figure 4:
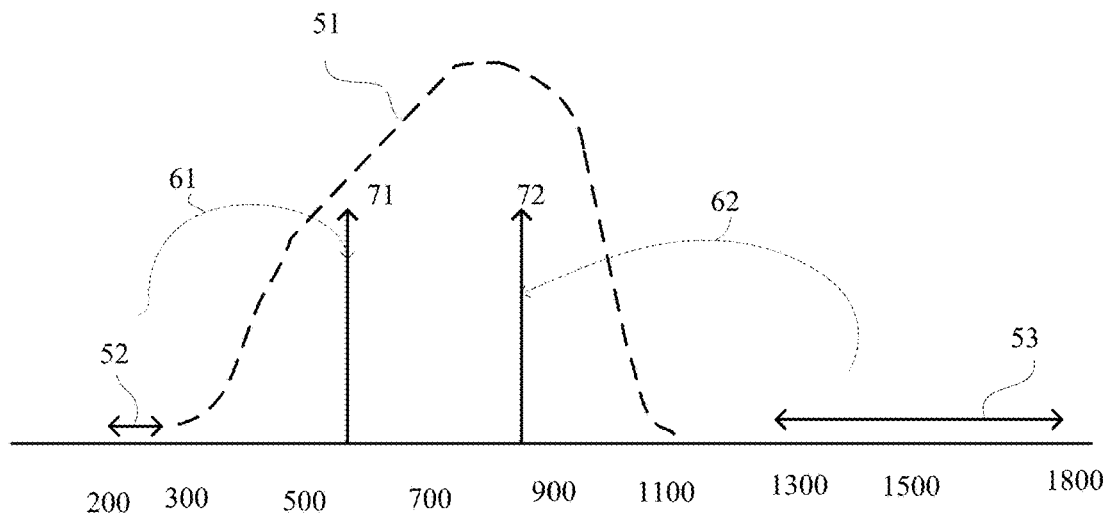
FIG. 4 illustrates an example of a certain spectral range, a first wavelength range below the certain spectral range, and a second wavelength range above the certain spectral range.
Figure 5:
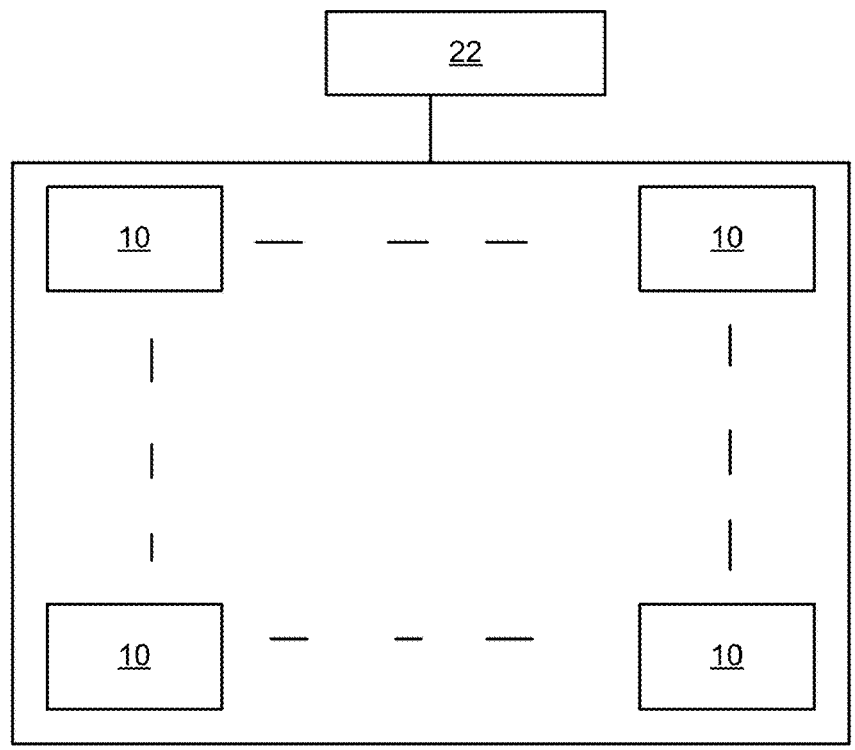
FIG. 5 illustrates an example of a method for sensing radiation.
Figure 6:
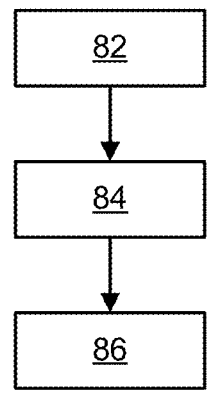
FIG. 6 illustrates an example of a method for manufacturing the sensor module.
Figure 7:
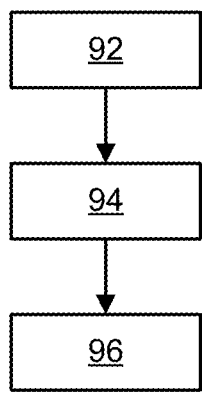
FIG. 7 illustrates an example of a device.

FIG. 4 illustrates an example of a certain spectral range (for example between 300 and 1100 nanometer), a first wavelength range 52 (for example between 200 and 280 nanometer) below the certain spectral range, and a second wavelength range 53 (for example between 1300 and 1800 nanometer) above the certain spectral range. The figure also illustrates frequency conversions (61 and 62) applied by luminescent elements that convert radiation within the first wavelength range 52 to radiation (71) within the certain spectral range, and convert radiation within the second wavelength range 53 to radiation (73) within the certain spectral range.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A sensor module that comprises optics and a sensor located downstream to the optics; wherein the optics comprises a self-assembling polymer and luminescent elements embedded in the self-assembling polymer; and wherein the optics are manufactured by a process that comprises selecting the polymer molecular weight of the self-assembling polymer based on a target thickness of a region formed by the self-assembling polymer.

2. The sensor module according to claim 1 wherein the self-assembling polymer forms a self-assembling polymer layer.

3. The sensor module according to claim 1 wherein the sensor has a certain spectral range; wherein the luminescent elements are configured to convert radiation outside the certain spectral range to radiation within the spectral range.

4. The sensor module according to claim 3 wherein the sensor has a certain spectral range; wherein the luminescent elements comprise up-conversion luminescent elements and down-conversion luminescent elements.

5. The sensor module according to claim 4 wherein the down-conversion luminescent elements are configured to convert radiation having a wavelength below 300 nanometer to radiation within the certain spectral range.

6. The sensor module according to claim 4 wherein the up-conversion luminescent elements are configured to convert radiation having a wavelength above 1000 nanometer to radiation within the certain spectral range.

7. The sensor module according to claim 4 wherein the up-conversion luminescent elements are configured to convert infrared radiation to radiation within the certain spectral range.

8. The sensor module according to claim 4 wherein the up-conversion luminescent elements are configured to convert radiation having a wavelength between 1300 nanometers to 1800 nanometers radiation within the certain spectral range.

9. The sensor module according to claim 1 comprising a readout circuit.

10. The sensor module according to claim 1 wherein the optics are manufactured by a process that comprises providing a solution made of the self-assembly polymer and luminescent elements that are dissolved into a solvent; and depositing the solution on the sensor.

11. The sensor module according to claim 1 wherein the optics consists essentially of the self-assembling polymer and the luminescent elements.

12. The sensor module according to claim 1 wherein the optics is without a window.

13. The sensor module according to claim 1 wherein the self-assembling polymer is exposed to an environment of the sensor module.

14. A sensor module that comprises optics and a sensor located downstream to the optics; wherein the optics comprises a self-assembling polymer and luminescent elements embedded in the self-assembling polymer; wherein the luminescent elements exhibit a delay period that does not exceed 10 microseconds.

15. A sensor module that comprises optics and a sensor located downstream to the optics; wherein the optics comprises a self-assembling polymer and luminescent elements embedded in the self-assembling polymer; wherein a polymer molecular weight of the self-assembling polymer exceeds 50 kDa.

16. A method for sensing radiation, the method comprises:
illuminating the sensor module by illuminating radiation; wherein the sensor module comprises optics and a sensor located downstream to the optics; wherein the optics comprises a self-assembling polymer and a group of luminescent elements embedded in the self-assembling polymer; wherein the optics is configured to convert radiation located in one or more frequency ranges outside a certain spectral range of the sensor to radiation within the certain spectral range; wherein the optics are manufactured by a process that comprises selecting the polymer molecular weight of the self-assembling polymer based on a target thickness of a region formed by the self-assembling polymer;

detecting, by the sensor, a response of the luminescent elements to the illumination by the illuminating radiation; and processing the response in order to provide information regarding the illuminating radiation.

17. The method according to claim 16 wherein the luminescent elements exhibit a delay period that does not exceed 10 microseconds.

18. The method according to claim 16 wherein a polymer molecular weight of the self-assembling polymer exceeds 50 kDa.

* * * * *